(12) United States Patent
Wu et al.

(10) Patent No.: US 8,697,529 B2
(45) Date of Patent: Apr. 15, 2014

(54) SCHOTTKY JUNCTION SOURCE/DRAIN TRANSISTOR AND METHOD OF MAKING

(75) Inventors: Dongping Wu, Shanghai (CN); Jun Luo, Shangahi (CN); Yinghua Piao, Shanghai (CN); Zhiwei Zhu, Shanghai (CN); Shili Zhang, Uppsala (SE); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/508,731

(22) PCT Filed: Sep. 28, 2011

(86) PCT No.: PCT/CN2011/080257
§ 371 (c)(1),
(2), (4) Date: May 8, 2012

(87) PCT Pub. No.: WO2012/088935
PCT Pub. Date: Jul. 5, 2012

(65) Prior Publication Data
US 2013/0270615 A1    Oct. 17, 2013

(30) Foreign Application Priority Data
Dec. 30, 2010  (CN) .......................... 2010 1 0613768

(51) Int. Cl.
*H01L 21/336* (2006.01)
*H01L 21/338* (2006.01)

(52) U.S. Cl.
USPC .............................. 438/303; 257/63; 257/616

(58) Field of Classification Search
USPC ..................... 438/303; 257/63, 616
See application file for complete search history.

(56) References Cited

U.S. PATENT DOCUMENTS

| | | | | |
|---|---|---|---|---|
| 6,190,977 | B1 * | 2/2001 | Wu ............................... | 438/300 |
| 7,067,379 | B2 * | 6/2006 | Wen et al. ..................... | 438/300 |
| 7,148,096 | B2 * | 12/2006 | Ohuchi ......................... | 438/197 |
| 7,446,026 | B2 * | 11/2008 | Zhang et al. .................. | 438/592 |
| 7,517,765 | B2 * | 4/2009 | Brunco et al. ................ | 438/300 |
| 7,563,657 | B2 * | 7/2009 | Chu ............................... | 438/149 |
| 7,776,732 | B2 * | 8/2010 | Chang et al. .................. | 438/595 |
| 7,843,007 | B2 * | 11/2010 | Chang et al. .................. | 257/350 |
| 7,855,135 | B2 * | 12/2010 | Chang et al. .................. | 438/596 |
| 8,058,167 | B2 * | 11/2011 | Snyder et al. ................. | 438/664 |
| 8,202,782 | B2 * | 6/2012 | Meunier-Bellard et al. .. | 438/303 |
| 8,216,907 | B2 * | 7/2012 | Chang et al. .................. | 438/304 |
| 2012/0038048 | A1 * | 2/2012 | Cabral et al. .................. | 257/741 |
| 2012/0171864 | A1 * | 7/2012 | Akiyama et al. .............. | 438/675 |

* cited by examiner

*Primary Examiner* — Matthew W Such
*Assistant Examiner* — Stephen C Smith
(74) *Attorney, Agent, or Firm* — Jamie J. Zheng, Esq.

(57) ABSTRACT

A method of making a transistor, comprising: providing a semiconductor substrate; forming a gate stack over the semiconductor substrate; forming an insulating layer over the semiconductor substrate; forming a depleting layer over the insulating layer; etching the depleting layer and the insulating layer; forming a metal layer over the semiconductor substrate; performing thermal annealing; and removing the metal layer. As advantages of the present invention, an upper outside part of each of the sidewalls include a material that can react with the metal layer, so that metal on two sides of the sidewalls is absorbed during the annealing process, preventing the metal from diffusing toward the semiconductor layer, and ensuring that the formed Schottky junctions can be ultrathin and uniform, and have controllable and suppressed lateral growth.

14 Claims, 7 Drawing Sheets

SCHOTTKY JUNCTION SOURCE/DRAIN TRANSISTOR AND METHOD OF MAKING

FIELD

The present invention is related to semiconductor processing technologies, and more particularly to a Schottsky junction source/drain transistor and method of making.

BACKGROUND

With the development of semiconductor technologies, metal-oxide-semiconductor field-effect-transistors (MOSFET) have gained wide applications. In the recent years, microelectronics technologies around silicon integrated circuits have been rapidly developed. The degree of integration for semiconductor chips basically follows Moore's law, i.e., it increases by doubling every 18 months. As the degree of integration of semiconductor chips continually increases, however, MOSFET channel length becomes shorter and shorter. When the MOSFET channel length becomes very short, short-channel effect can degrade the performance of semiconductor chips, causing them to even malfunction.

As the feature sizes of MOSFET devices continue to shrink, source/drain junction depths need to be more and more shallow in order to suppress the short-channel effect. The more and more shallow source/drain junction depths, however, together with limitations on dopant solid solubility, result in MOSFET source/drain parasitic resistance to become greater and greater, placing more and more demand on source/drain metal silicide (small-scale MOSFET typically use nickel silicide). Nickel silicide at the source/drain regions is usually formed by deposited nickel (Ni) reacting with silicon during annealing. It not only has relatively low resistivity and contact resistance, but is also compatible with common silicon processing technologies. Nowadays, self-aligned nickel silicide processes are key processes for making CMOS integrated circuits. Advancement in processing technologies requires that the silicide be thinner and thinner, sometimes even below 10 nm, its surface should have good thermal stability, without appearance of agglomeration, its resistivity be kept at a relatively small value, and there be little lateral growth. These requirements pose various challenges for the metallization processes at source/drain regions of nano-scale devices.

Schottky junction metal silicide sources and drains have become research hotspots recently, for the purpose of using Schottky junction metal silicide sources and drains to replace conventional heavily doped P-N junction sources and drains for super-miniaturized CMOS devices in the future. The main advantages of metal silicide source/drain are its low parasitic resistance and capacitance, good scale down characteristics, easy fabrication processes, low thermal budget, anti-latch-up effect and floating-body effect in silicon-on-insulator (SOI) substrate. Because Schottky junction metal silicide source/drain has low resistance characteristics and steep atomic layer level interface between the silicide and silicon, Schottky-barrier MOSFET devices are expected to scale down to 10 nm and below.

FIG. 1 is a structural diagram of a conventional Schottky metal silicide source/drain transistor, which includes a substrate 100, gate electrode stack 110, sidewalls 121 and 122, source Schottky junction 131 and drain Schottky junction 132. Gate stack 110 is disposed on the substrate 100, sidewalls 121 and 122 are disposed on two sides of the gate stack 110, source Schottky junction 131 and drain Schottky junction 132 are set in the substrate 100 on two sides of the sidewalls 121 and 122, forming the source and drain of the transistor. Source Schottky junction 131 and drain Schottky junction 132 are typically composed of nickel silicide or the like, and formed using self-aligned processes. In the so-called self-aligned processes, a layer of metal is first formed to cover the surfaces of the source/drain regions, and annealing is used to form metal silicides at the source and drain regions.

The above structure has the following shortcomings. During the self-aligned processes to form nickel silicides at the source/drain regions of the MOSFET, because nickel basically does not react with the sidewalls 121 and 122, in addition to the nickel on the surfaces of the substrate 100 at the source/drain regions diffusing into the substrate 100 and forming nickel silicides, the nickel covering the sidewalls 121 and 122 may also diffuse toward the substrate 100. After the nickel on the surfaces of the substrate 100 at the source and drain regions has been converted into nickel silicides, the nickel on the sidewalls 121 and 122 may continue to diffuse toward the source/drain regions of the silicon substrate. This leads to the formed nickel silicide to have uncontrollable and non-uniform thickness, and excessive lateral growth under the gate electrode 110, resulting in shortened channel length, reduced transistor threshold voltage, and increased leakage current.

Therefore, how to form a nickel silicide layer with a ultra-thin and uniform vertical dimension, and controllable and suppressed lateral growth, is a key challenge for the future P-N junction source/drain or Schottky junction source/drain MOSFET fabrication processes.

SUMMARY

The present invention intends to solve the technological problem of providing a method of making transistors, which is capable of forming a Schottky junction with a ultra-thin and uniform vertical dimension, and controllable and suppressed lateral growth.

To solve the above problem, the present invention provides a method of making a transistor, comprising: providing a semiconductor substrate; forming a gate stack over the semiconductor substrate; forming an insulating layer over the semiconductor substrate, the insulating layer further covering the gate stack; forming a depleting layer over the insulating layer; etching the depleting layer and the insulating layer to form composite sidewalls on two sides of the gate stack, an upper outside part of each sidewall being formed of the depleting layer while a remainder part of each sidewall being formed of the insulating layer; forming a metal layer over the semiconductor substrate, the metal layer further covering the gate stack and the sidewalls; performing a thermal annealing process to form source/drain Schottky junctions in the semiconductor substrate on two sides of the gate stack, wherein, during the annealing process, metal covering the sidewalls is absorbed by reaction with the depleting layer in the composite sidewalls; and removing the metal layer on the semiconductor substrate and reaction product from the metal reacting with the depleting layer in the composite sidewalls.

In some embodiments, the metal layer includes nickel;

In some embodiments, the depleting layer includes germanium;

In some embodiments, removing the metal layer is by chemical etching, using an etchant solution including sulfuric acid and hydrogen peroxide.

In some embodiments, the thermal annealing process further comprises first and second annealing steps, the first annealing step being performed with annealing temperature ranging from 250° C. to 350° C., the second annealing step being performed with annealing temperature ranging from 350° C. to 600° C.

As advantages of the present invention, the upper outside parts of the sidewalls include a material that can react with the metal layer, so that metal on two sides of the sidewalls is absorbed during the annealing process, preventing the metal from diffusing toward the semiconductor layer, and ensuring that the formed Schottky junctions can be ultra-thin and uniform, and have controllable and suppressed lateral growth.

DESCRIPTION OF EMBODIMENTS

A method of making a transistor according to embodiments of the present invention is described in detail below with reference to the drawings.

Figure 1:
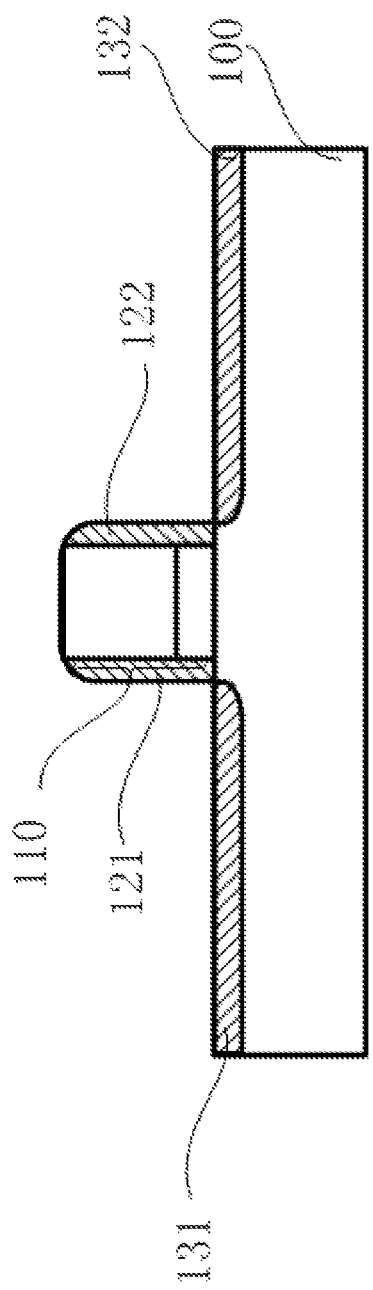
FIG. 1 is a structural diagram of a conventional Schottky junction metal silicide source/drain transistor.
Figure 2:
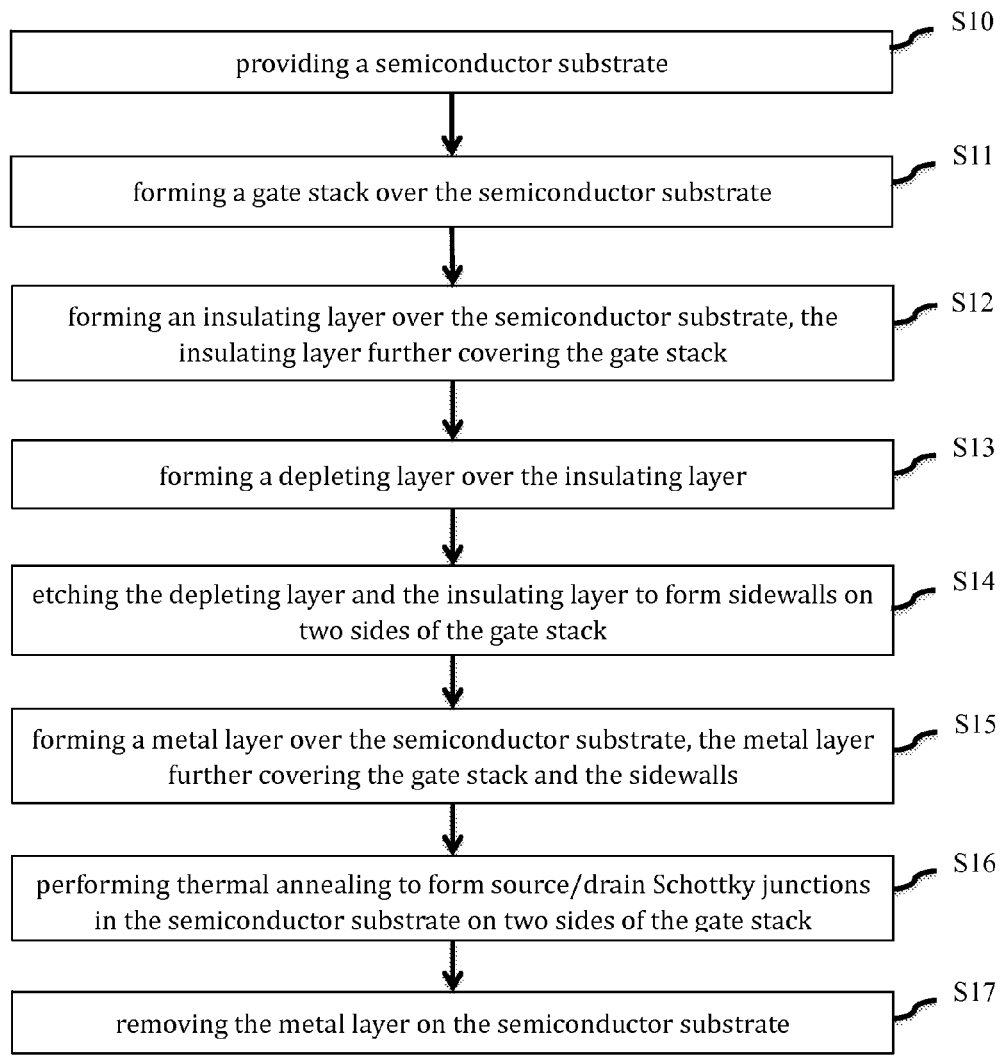
FIG. 2 is a flowchart illustrating a method according to embodiments of the present invention.

FIG. 2 is a flowchart illustrating a method for forming a Schottky junction source/drain transistor according to embodiments of the present invention. The method comprises: providing a semiconductor substrate (S10); forming a gate stack over the semiconductor substrate (S11); forming an insulating layer over the semiconductor substrate, the insulating layer further covering the gate stack (S12); forming a depleting layer over the insulating layer (S13); etching the depleting layer and the insulating layer to form composite sidewalls on two sides of the gate stack (S14); forming a metal layer over the semiconductor substrate, the metal layer further covering the gate stack and the sidewalls (S15); performing a thermal annealing process to form source/drain Schottky junctions in the semiconductor substrate on two sides of the gate stack (S16); and removing the metal layer on the semiconductor substrate (S17).

FIGS. 3A to 3H are process diagrams illustrating the above method.

Figure 3A:
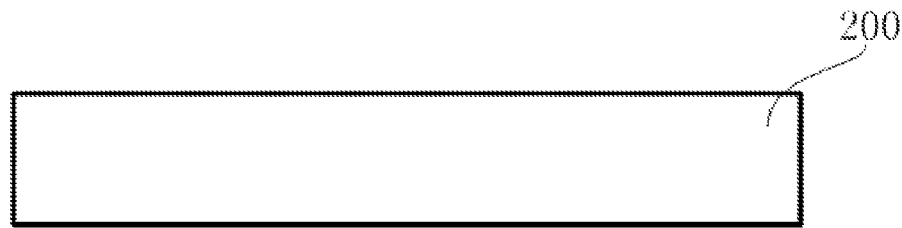
FIGS. 3A to 3H are process diagrams illustrating the method according to embodiments of the present invention.

As shown in FIG. 3A, referring also to S10, a semiconductor substrate 200 is provided. The semiconductor substrate 200 can be either N-type or P-type, and made of any common substrate materials, including single crystal silicon substrate. In certain embodiments, the semiconductor substrate 200 is composed of single crystal silicon.

Figure 3B:
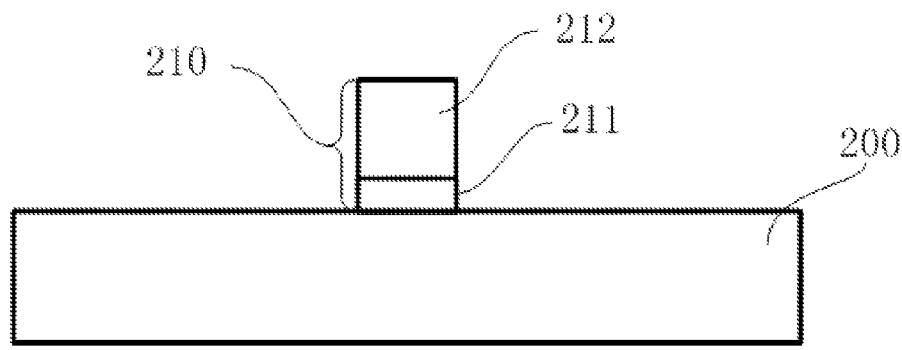

As shown in FIG. 3B, referring also to S11, a gate stack 210 is formed over the semiconductor substrate 200. The gate stack 210 includes a dielectric layer 211 and a polysilicon layer 212, and forms a main part of a gate electrode of the transistor. The dielectric layer 211 can include silicon dioxide or other high-dielectric-constant materials such as $HfO_2$, etc. Its function is to insure that the polysilicon layer 221 and the semiconductor substrate 200 are electrically isolated from each other. Conductive layer 212 can be polysilicon or another conductive material. Its function is to induce a conductive channel in the semiconductor substrate 200 via applied electrical signals.

Figure 3C:
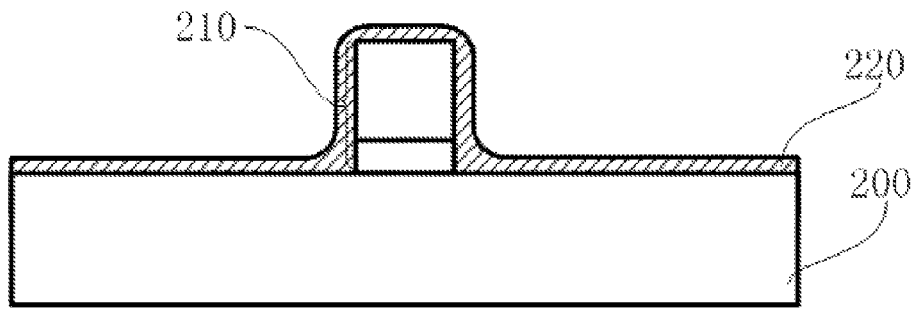

As shown in FIG. 3C, referring also to S12, an insulating layer 220 is formed over the semiconductor substrate 200, the insulating layer 220 further covering the gate stack 210. The insulating layer 220 can include silicon dioxide or any other common insulating materials, and can be fabricated using a chemical vapour deposition process. The insulating layer 220 is used to form sidewalls in subsequent processes.

Figure 3D:
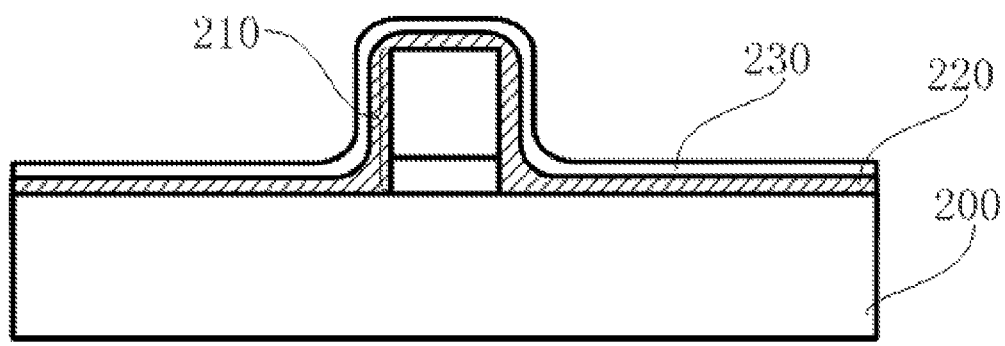

As shown in FIG. 3D, referring also to S13, a depleting layer 230 is formed over the insulating layer 220. The material used to form the depleting layer 230 should be selected according to the material used to form the subsequent metal layer, based on the principle that it can react with the material used to form the metal layer under high temperature and that the product from such reaction can be selectively removed by subsequent chemical etching. For example, in one embodiment, when nickel is selected as the material used to form the subsequent metal layer, germanium can be selected to be the material used to form the corresponding depleting layer 230. The depleting layer 230 can be grown using a chemical vapour deposition process or magnetron sputtering process, etc.

Figure 3E:
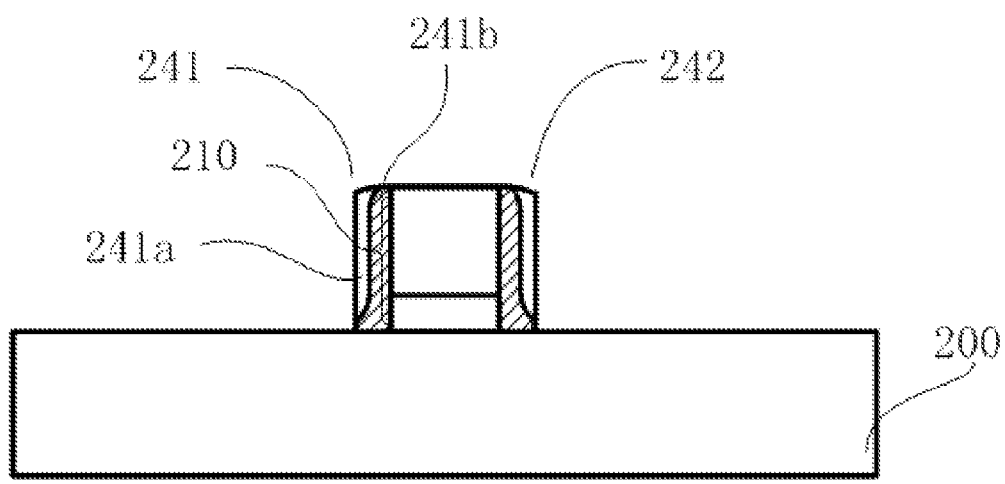

As shown in FIG. 3E, referring also to S14, the insulating layer 220 and the depleting layer 230 are etched to form sidewalls 241 and 242 on two sides of the gate stack 210. One or more dry etching processes are used to etch these layers, and etchant gas(es) are selected based on specific materials used to form the insulating layer 220 and the depleting layer 230. Because the etching is anisotropic, sidewalls 241 and 242 can be formed on two sides of the gate stack 210. The sidewalls 241 and 242 are composite sidewalls. Using sidewall 241 as an example, the upper outside part 241a is made of a remaining portion of the depleting layer 230 after the etching, while a remainder part 241b of the sidewall is made of a remaining portion of the insulating layer after the etching.

Figure 3F:
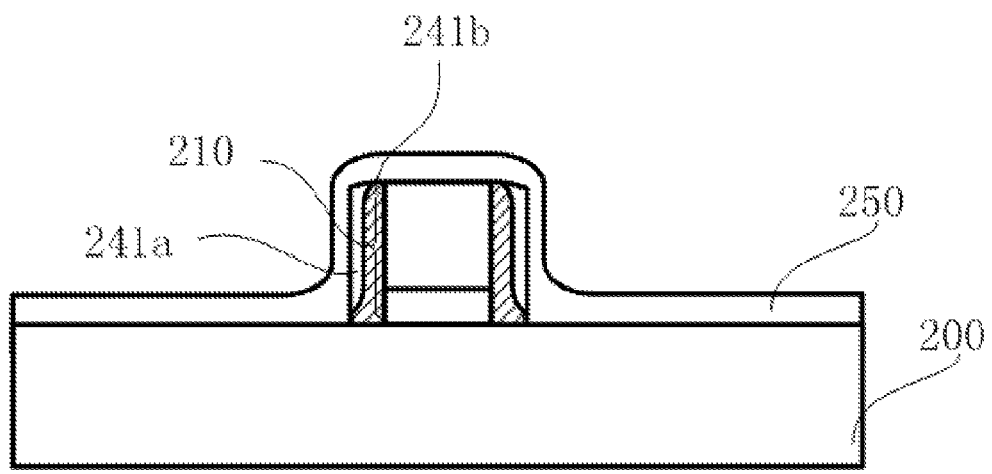

As shown in FIG. 3F, referring also to S15, a metal layer 250 is formed over the semiconductor substrate 200, the metal layer 250 further covering the gate stack 210 and sidewalls 241 and 242. In one embodiment, the metal layer 250 includes nickel, and is formed using thermal evaporation, electron beam evaporation or magnetron sputtering, etc. The metal layer 250 formed during this step covers especially surfaces of the semiconductor substrate on two sides of the sidewalls 241 and 242. These regions will be used to form the source and drain of the transistor.

Figure 3G:
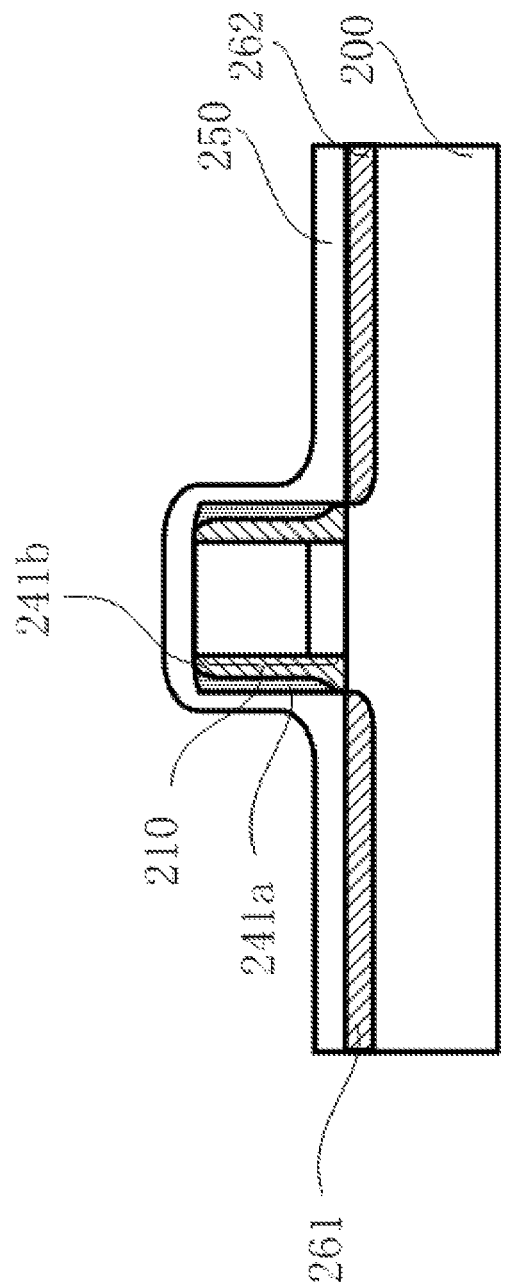

As shown in FIG. 3G, in S16, thermal annealing is performed to form source Schottky junction 261 and drain Schottky junction 262 in the semiconductor substrate 200 on two sides of the gate stack 210. Under high temperature, the metal will react with the semiconductor substrate, forming Schottky junctions between the metal and the semiconductor substrate. If the substrate 200 includes single crystal silicon, metal silicide is formed. The annealing further includes first and second annealing steps: the first annealing step uses an annealing temperature ranging from 250° C. to 350° C., and the second annealing step used an annealing temperature ranging from 350° C. to 600° C. The annealing should use ambient gases that would not react with the samples, such as high-purity nitrogen or inert gases. The annealing time or other parameters can be selected based on specific annealing methods used. In this step, because the sidewalls 241 and 242 are composite sidewalls, the upper outside part 241a is composed of the remaining portion of the depleting layer 230 after the etching. Therefore, the upper outside part 241a can react with the metal layer 250 and depletes the metal layer on two sides of the sidewalls 241 and 242, preventing excessive amount of metal diffusing toward the substrate 200. To reach best results, the depleting layer 230 should have sufficient thickness to ensure that the metal layer 250 deposited thereon is fully consumed. A thicker depleting layer 230 means that the upper outside part 241a of the sidewall 241 and the corresponding part of the sidewall 242 can have greater lateral width, so as to ensure that more metal is consumed instead of entering the semiconductor substrate 200. A minimum thickness of the depleting layer 230 is proportional to a thickness of the metal layer 250 deposited thereon, meaning that, as the junction depth decreases, the deposited metal layer 250 becomes thinner, and the minimum thickness of the depleting layer 230 can be reduced accordingly.

Figure 3H:
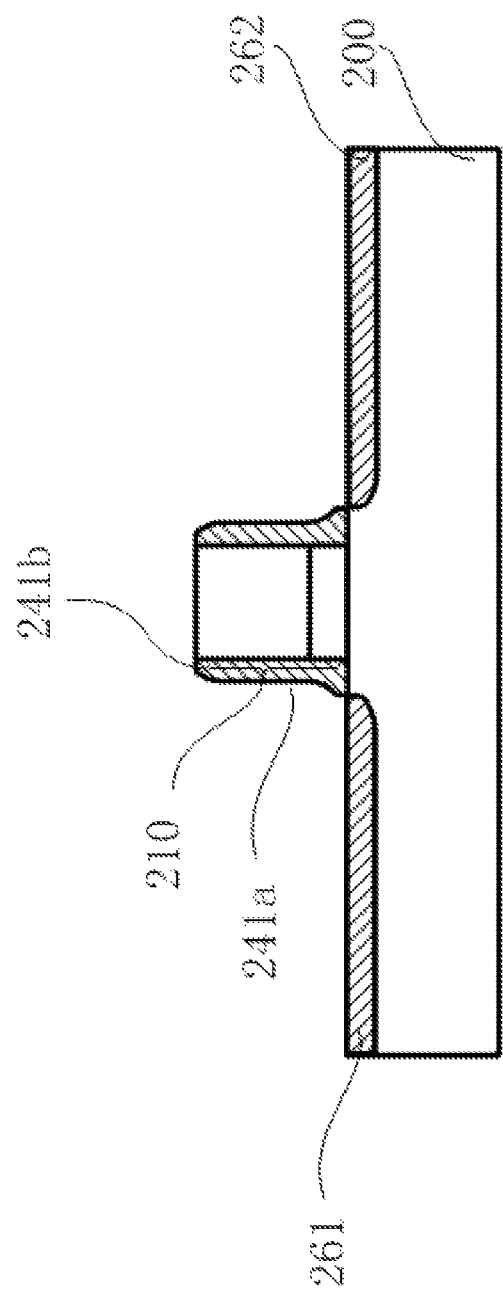

As shown in FIG. 3H, in step S17, the metal layer 250 on the surfaces of the semiconductor substrate 200 is removed. This step can be performed using chemical etching, with an etchant solution that is capable of removing the unreacted metal and the reaction product from metal reacting with the depleting layer, without reacting with the formed Schottky junctions. In one embodiment, the metal layer 250 is composed of nickel, and Schottky junctions are composed of nickel silicide, the reaction product from the depleting layer reacting with the metal is nickel germanide, and thus a mixture containing sulfuric acid and hydrogen peroxide can be selected to be the etchant solution.

After the above steps, metallization processes can be used to form interconnecting metal lines over the semiconductor substrate, so as to eventually form the Schottky junction source/drain transistor. Because the upper outside parts of the sidewalls 241 and 242 are composed of materials that can react with the metal layer 250, the metal layer 250 on two sides of the sidewalls can be absorbed during annealing, preventing the metal from diffusing into the semiconductor substrate 200.

The preferred embodiments of the present invention are discussed above. It should be noted that, without departing from the spirit and scope of the present invention, those skilled in the art can make various improvements and modification, which should be deemed to be within the scope of protection of the present invention.

We claim:

1. A method of making a transistor, comprising:
   providing a semiconductor substrate;
   forming a gate stack over the semiconductor substrate;
   forming an insulating layer over the semiconductor substrate, the insulating layer further covering the gate stack;
   forming a depleting layer over the insulating layer;
   etching the depleting layer and the insulating layer to form composite sidewalls on two sides of the gate stack, an upper outside part of the sidewalls being formed of the depleting layer while a remainder part of the sidewalls being formed of the insulating layer;
   forming a metal layer over the semiconductor substrate, the metal layer further covering the gate stack and the sidewalls;
   performing thermal annealing to form source/drain Schottky junctions in the semiconductor substrate on two sides of the gate stack, wherein, during the annealing, metal covering the sidewalls is absorbed by reaction with the depleting layer in the composite sidewalls; and
   removing the metal layer on the semiconductor substrate and reaction product from metal reacting with the depleting layer in the composite sidewalls.

2. The method of claim 1, wherein the semiconductor substrate includes single crystal silicon and the metal layer includes nickel.

3. The method of claim 2, wherein the depleting layer includes germanium.

4. The method of claim 2, wherein removing the metal layer is by chemical etching, using an etchant solution including sulfuric acid and hydrogen peroxide.

5. The method of claim 1, wherein the thermal annealing further comprises first and second annealing steps, the first annealing step being performed with annealing temperature ranging from 250 ° C. to 350 ° C., the second annealing step being performed with annealing temperature ranging from 350 ° C. to 600 ° C.

6. The method of claim 1, wherein the depleting layer includes germanium.

7. The method of claim 1, wherein the depleting layer in the composite sidewall is separated from the substrate by the insulator layer.

8. A transistor made by:
   forming a gate stack over a semiconductor substrate;
   forming sidewalls on two sides of the gate stack, each respective sidewall comprising a depleting layer forming an upper outside part of the respective sidewall and an insulating layer forming a remainder part of the respective sidewall;
   forming a metal layer over the semiconductor substrate, the metal layer further covering the gate stack and the sidewalls; and
   performing thermal annealing to form source/drain Schottky junctions in the semiconductor substrate on two sides of the gate stack, wherein, during the annealing, the depleting layer reacts with parts of the metal layer covering the sidewalls to prevent metal in the parts of the metal layer from diffusing toward and reacting with the semiconductor substrate.

9. The transistor of claim 8, wherein forming the sidewalls comprises:
   forming the insulating layer over the semiconductor substrate;
   forming the depleting layer over the insulating layer; and
   etching the depleting layer and the insulating layer to form the sidewalls.

10. The transistor of claim 8, further comprising removing unreacted metal in the metal layer and reaction product from the depleting layer reacting with the parts of the metal layer covering the sidewalls.

11. The transistor of claim 10, wherein removing is by chemical etching, using an etchant solution including sulfuric acid and hydrogen peroxide.

12. The transistor of claim 8, wherein the semiconductor substrate includes single crystal silicon and the metal layer includes nickel.

13. The transistor of claim 12, wherein the depleting layer includes germanium.

14. The transistor of claim 8, wherein the thermal annealing further comprises first and second annealing steps, the first annealing step performed with annealing temperature ranging from 250° C. to 350° C., the second annealing step performed with an annealing temperature ranging from 350° C. to 600° C.

* * * * *